United States Patent [19]
Grosshart

[11] Patent Number: 5,948,283
[45] Date of Patent: Sep. 7, 1999

[54] METHOD AND APPARATUS FOR ENHANCING OUTCOME UNIFORMITY OF DIRECT-PLASMA PROCESSES

[75] Inventor: Paul F. Grosshart, Billerica, Mass.

[73] Assignee: Lam Research Corporation, Fremont, Calif.

[21] Appl. No.: 08/671,767

[22] Filed: Jun. 28, 1996

[51] Int. Cl.$^6$ .................. H01L 21/3065; H05H 1/02; H05H 1/24
[52] U.S. Cl. .................. 216/67; 118/666; 118/697; 118/723 E; 118/724; 118/725; 156/345; 427/573; 438/710; 438/715; 216/71
[58] Field of Search .................. 118/666, 697, 118/724, 725, 723 MW, 23 MR, 723 MA, 723 AN, 723 E, 723 I; 156/345; 427/573; 216/71, 67; 438/710, 715

[56] References Cited

U.S. PATENT DOCUMENTS

| | | | |
|---|---|---|---|
| 3,664,942 | 5/1972 | Havas et al. | 204/192.33 |
| 4,565,601 | 1/1986 | Kakehi et al. | 156/345 |
| 4,949,783 | 8/1990 | Lakios et al. | 165/80.1 |
| 5,200,023 | 4/1993 | Gifford et al. | 216/59 |
| 5,248,371 | 9/1993 | Maher et al. | 156/345 |
| 5,279,865 | 1/1994 | Chebi et al. | 427/574 |
| 5,556,500 | 9/1996 | Hasegawa et al. | 156/345 |

FOREIGN PATENT DOCUMENTS

| | | | |
|---|---|---|---|
| 5-29264 | 2/1993 | Japan | 118/724 |
| 6-177080 | 6/1994 | Japan . | |

OTHER PUBLICATIONS

Loewenstein, Lee M. et al., First–wafer effect in remote plasma processing: The stripping of photoresist, silicon nitride, and polysilicon , J. Vac. Sci. Technol. B 12(4), Jul./Aug. 1994, pp. 2810–2817.

Nakamura, M. et al., The effect of wafer temperature on reactive ion etching, Proc. Electrochem Soc., 1988, pp. 78–85.

Butler, Stephanie Watts et al., First wafer effect on ellipsometer metrics and spatial etch pattern of polysilicon gate etch, SPIE, vol. 2091, 1993, pp. 391–403.

Barna, G.G. et al., Sensor Integration into plasma etch reactors of a developmental pilot line, J. Vac. Sci. Technol. B 12(4), Jul./Aug. 1994, pp. 2860–2867.

Stefani, Jerry, On–Line Diagnostic Monitoring of Photoresist Ashing, IEEE Transactions on Semiconductor Manufacturing, vol. 8, No. 1, Feb. 1995, pp. 2–9.

Translation of Japanese Patent Application 06–177080, Jun. 24, 1994.

*Primary Examiner*—Jeffrey E. Russel
*Attorney, Agent, or Firm*—Cesari and McKenna, LLP

[57] ABSTRACT

The invention provides method and apparatus that control the thermal environment of the first substrate or substrate of series of substrates treated by a uniform direct-plasma, in order to reduce first-wafer effect. By providing supplemental heat to the substrate in treatment or, equivalently, reducing the rate of heat extraction from the substrate in treatment, early in the series, the invention creates steady-state process conditions that reduce substrate-to-substrate variability in process outcome.

72 Claims, 2 Drawing Sheets

METHOD AND APPARATUS FOR ENHANCING OUTCOME UNIFORMITY OF DIRECT-PLASMA PROCESSES

FIELD OF THE INVENTION

This invention relates to materials processing techniques using an excited gaseous medium. Particularly, this invention relates to methods and apparatus for reducing the first-wafer effect in direct-plasma-driven processes.

BACKGROUND OF THE INVENTION

In one approach to materials processing, a substrate is exposed to excited species such as ions or neutral radicals that interact physically or chemically with the substrate so as to effect deposition of material onto or removal of material from the substrate. The excited species are part of an excited gaseous processing medium, for example, a plasma, generated by applying electromagnetic excitation to a reactant gas composition; process parameters such as power level and pressure are chosen to effect the desired process rate and selectivity. Plasma-assisted chemical vapor deposition, plasma ashing and plasma etching, all widely used in the semiconductor industry, embody this approach. For example, in reactive-ion etching systems, both ionic and neutral radical elements participate in the process. Material is removed from the substrate by relatively volatile species created by reaction of radicals with the substrate material; ions impinging the surface provide the energy needed to eject substrate material from the substrate so it can react with a radical, or may volatilize reaction products residing on the substrate.

The plasma is ordinarily generated by applying an oscillating electromagnetic field to a reactant gas composition in order to excite collisions between the molecules that result in ionization or other excitation. Many approaches to applying this excitation have been developed for plasma etching. For the purposes of this disclosure, the phrase "direct-plasma processing" refers to plasma processes in which the substrate is located in an active region containing the plasma, near a powered electrode energized to generate the plasma. For example, in parallel plate reactors, such as are shown in U. S. Pat. Nos. 4,626,312 and 5,248,371, the plasma is generated in situ between a pair of opposing plate electrodes in a diode or triode configuration by a radio frequency ("rf") electrical field oriented perpendicularly to the ;substrate, which is supported by one of electrodes, so that positive ions are accelerated toward it. Variations of this design have incorporated additional electrical or magnetic power sources. For example, Skidmore, *Semiconductor International,* 1989, pp. 74–79 and U. S. Pat. No. 4,668,338 describe systems incorporating additional magnetic fields for enhancing the plasma density.

By contrast, in so-called "remote-plasma processing", creation of the reactive species is removed from the vicinity of the substrate and does not involve the substrate support. For example, the plasma may be generated in the region of the chamber opposite the substrate by a rf current resonated through a planar coil disposed outside of the reactor chamber. Or, the plasma may be created upstream of a main etching chamber with the reactive constituents being subsequently transported to the main chamber where the etching takes place.

Both types of plasma etching reactors generally incorporate a system, operated in a constant manner during treatment of a series, for removing heat from the substrate. These are present primarily for preventing excessive substrate temperatures in steady-state operation due to, for example, ion bombardment, exothermic chemical reactions or, in direct-plasma processes, waste heat from plasma generation. A mechanism for providing a medium such as inert gas between the substrate and the support is often used to enhance thermal contact between substrate and support. Commonly, a chiller system for receiving excess heat from the substrate support includes a fluid that circulates at a constant rate through the support, thereby receiving heat and carrying it convectively to a refrigeration source, such as a thermostatted liquid bath, to which the heat is transferred. The circulating fluid is usually maintained at a temperature between 0° C. and 500° C. Water is often used as the fluid for these systems; the water circulation rate and properties of the refrigeration source are chosen to maintain the water it a temperature lower than 100° C. throughout the process. For higher temperatures, an alternate fluid such as helium is used. Limiting the substrate temperature is particularly important for etching operations, because the patterning material may incinerate at substrate temperatures higher than about 150° C.

In the manufacture of semiconductor devices, plasma processes arc typically applied to a series of several nominally identical substrates, individually treated in succession by a uniform process. As used in this disclosure, the phrase "uniform process" indicates that each substrate of the series is treated under nominally identical process conditions. A disparity between the process characteristics—for example, etch rate and etch selectivity—of the initial wafers treated by a uniform process and the characteristics of subsequent wafers in the same series has been observed for some plasma processes. This phenomenon has been named the "first-wafer effect." Depending on the characteristic affected and the stringency of its specification, substrates exhibiting the first-wafer effect may be unacceptable, thus reducing the process yield. Although possible causes of the first wafer effect have been investigated, particularly for remote-plasma ashing, process control literature has emphasized accounting or compensating for this effect rather than eliminating it.

DESCRIPTION OF THE INVENTION

Brief Summary of the Invention

The invention reduces the variability of processing outcomes observed for the first substrate or substrates of a series treated by a uniform direct-plasma process by eliminating or shortening the thermal transient in the early stages of the treatment. Generally, only a fraction of the rf power delivered to the reactor for plasma generation in direct-plasma systems is efficiently coupled to the reactant gas composition. The remainder of the applied power appears as waste heat, transferred to the electrodes and to components in contact with them, such as the substrate. Early in the treatment, the waste heat flux into the electrode causes the electrode temperature to rise until the positive heat flux is balanced by loss through conductive, convective and radiative processes, and a steady state condition is established. The transient substrate or sequence of substrates, namely those substrate(s) in thermal contact with the electrode during the initial build-up of waste heat in the electrode, experience a thermal environment different from that of the subsequent substrates, which are treated under the constant-temperature steady-state condition. Depending on the system, this difference in thermal environment may cause variability in etch rate—or conversely etch time—selectivity or anisotropy among substrates. By providing supplemental heat to the system or, equivalently, reducing the rate of heat extraction from the system, particularly with respect to a powered electrode supporting the substrate, the invention brings the system to steady-state condition earlier than would occur with a uniformly operating heat-removal system geared primarily toward limiting the maximum substrate temperature. Thus the transient substrate or substrates are treated under thermal process conditions that are more similar to those experienced by the subsequent substrates in the series, thereby improving substrate-to-substrate uniformity in the process outcome.

Specifically, the invention makes the processing environment more uniform over the series of substrates by holding a process temperature at a substantially constant steady-state value during treatment of the transient substrate(s). As used in this description, the phrase "process temperature" refers to a temperature in the system which reflects the thermal state of the substrate. Thus, the process temperature may be the temperature of the substrate itself or of a component in thermal contact with it, such as the medium thermally coupling the substrate to the electrode, the electrode itself or the fluid circulating through the electrode.

As also used in this description, the phrase "steady-state value" refers to the process temperature value imposed by the invention during treatment of the transient substrate(s). The steady-state value imposed for a given treatment process may be chosen empirically or theoretically. For example, in one approach, the steady-state value is the value that the process temperature has been previously observed to assume under steady-state conditions during treatment of a similar set of substrates by the same process with similar electrode chiller configuration. An alternative is to choose as steady-state value the process temperature value that optimizes some aspect of the process and to control the process temperature to this value during treatment of the entire series.

In accordance with the invention, control of the process temperature may be passive or active. According to one embodiment, the invention regulates the process temperature without temperature feedback. In this case, the control means used to maintain the process temperature at the steady-state value effects heat exchange with the electrode or other body by adjustment of one or more temperature-control parameters according to a preprogrammed schedule. In an alternate embodiment, the process temperature is continually monitored and temperature-control parameters adjusted based on the value observed in situ to bring the process temperature to the setpoint, equal to the steady-state value. For some processes maintaining a substantially constant process temperature during treatment of the transient substrate(s) requires active control of the process temperature before treatment of the initial substrate begins.

The response time of the control system used to regulate the process temperature may hinder absolute conformity of the process temperature to the steady-state value at all times. Although it is preferable to maintain an absolutely constant process temperature to achieve optimum substrate-to-substrate uniformity in the process outcome, the invention may provide substantial benefit even when the initial thermal transient is not completely eliminated. As used to describe the process temperature in this description, the phrase "substantially constant" indicates that the variation of the process temperature over time is sufficiently insignificant to improve the uniformity in process outcome over a series of substrates.

In a preferred embodiment, the temperature of the powered electrode supporting a substrate in treatment is maintained at a constant steady-state value. The desired steady-state value is programmed into a controller, which also receives continual input from a temperature sensor in thermal contact with the electrode; thermal contact may be effected by, for example affixing the sensor to the electrode or by positioning it in the flow of water circulating therethrough. Water circulates through the electrode and a heat exchanger at a constant flow rate. The heat exchanger is operated by the controller to adjust the water temperature based on the sensed electrode temperature and the preprogrammed steady-state value. Early in the treatment of a series of wafers and, optionally, before initiating treatment of the series, the controller maintains the temperature of the water exiting the heat exchanger at a relatively high value; this procedure removes heat from the electrode at a sufficiently low rate or, equivalently, provides heat to the electrode at a sufficiently high rate to bring the electrode quickly to the steady-state value. As rf-generated heat accumulates in the electrode, the controller reduces the temperature of the water leaving the heat exchanger to a relatively low value to provide a heat sink that balances the steady state heat flow into the electrode, thereby stabilizing the electrode temperature at the steady-state value.

In a variation of this embodiment, the heat exchanger adjusts the water temperature to a constant value. Water leaving the heat exchanger is conveyed from the heat exchanger to the electrode through two parallel pathways: a flow-restricted conduit fitted with a heater and a conduit gated by a valve coupled to the controller. Initially, the valve is opened to allow only a small water flow rate through it, thereby forcing a relatively large proportion of the water en route to the electrode to pass through the heated conduit. Then, the valve becomes less restrictive, so that a larger proportion of the water bypasses the heater.

BRIEF DESCRIPTION OF THE DRAWINGS

The foregoing discussion will be understood more readily from the following detailed description of the invention, when taken in conjunction with the accompanying drawings, in which like reference numerals indicate identical or functionally similar elements.

It will be appreciated that, for purposes of illustration, these figures are not necessarily drawn to scale.

DETAILED DESCRIPTION OF THE INVENTION

Figure 1:
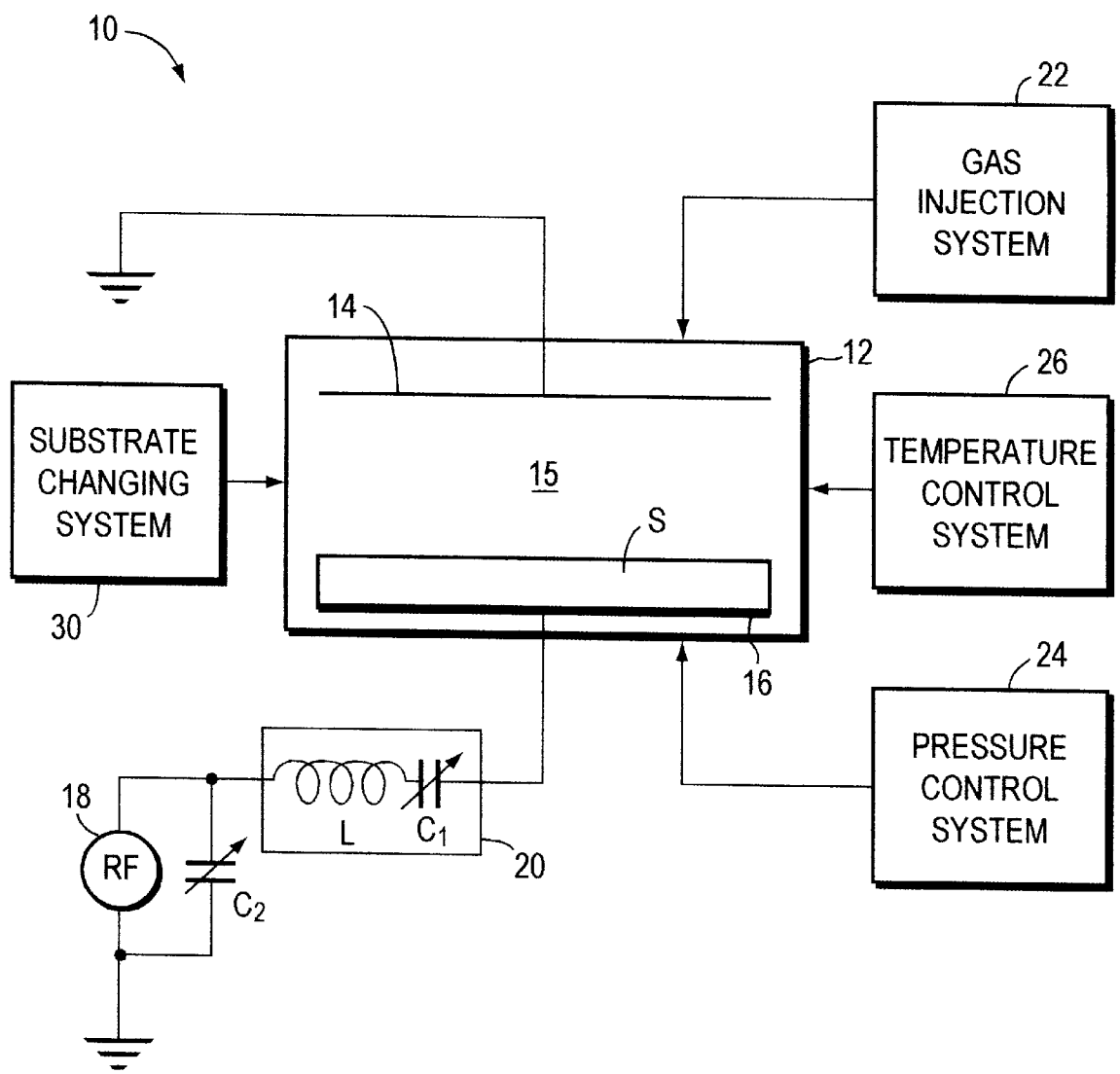
FIG. 1 schematically illustrates a typical prior-art diode reactor.

With reference first to FIG. 1, a typical diode reactor of the prior art for direct-plasma etching, generally designated at 10, includes a reactor compartment 12 with an upper electrode 14 and a lower electrode 16 in opposition across an active region 15. The lower electrode 16 supports a substrate S, for example, a semiconductor wafer. The upper electrode 14 is grounded. The lower electrode 16 is coupled to an rf electrical energy source 18 via a matching network 20 including a first variable capacitor, indicated by $C_1$, and an inductor, indicated by L, connected in series with the electrode 16 and with the parallel combination of the source 18 and second a variable capacitor, indicated by $C_2$. A gas injection system 22 is coupled to the reaction compartment 12 to allow the introduction of gaseous species into the compartment 12. A pressure control system 24 is coupled to the compartment 12 so as to control the pressure therewithin. A temperature control system 26 is coupled to the compartment 12 so as to control the temperature of various other components in the compartment 12. A substrate-changing system 30 is coupled to the compartment 12 so as to consecutively position substrates to be treated by a uniform process on the lower electrode 16. In operation, the application of rf power from the source 18 to the electrodes 14 and 16 controllably produces a reactive ion etch ("RIE") plasma therebetween in the well-known manner. Typically, the lower electrode 16 receives a negative bias and functions therefore as the cathode, with the upper electrode 14 playing the role of anode.

In one embodiment, the gas injection system 22 includes a gas diffuser, not shown, positioned between the upper electrode 14 and the lower electrode 16, which provides an optimum flow pattern of injected gas within the reaction compartment 12. In some reactors the upper electrode 14 has a plurality of apertures, not shown, through which gas enters the active region 15. For etching applications, the injected gas composition generally includes oxygen and/or a halogenous species. Depending on the substrate material and the available operating conditions, the injected gas composition for etching generally includes any one or several of oxygen, chlorine, boron trichloride, nitrogen, carbon or silicon tetrachloride, trifluoromethane, tetrafluoromethane, nitrogen trifluoride, sulfur hexafluoride, or hexafluoroethane. The injected gas composition generally also includes a carrier gas such as hydrogen or an inert gas. However, any gas mixture providing reactants from which the processing medium may be generated is appropriate for incorporation into a system of the invention.

The pressure control system 24 usually includes a pressure sensor, not shown, positioned inside the chamber 12, that provides feedback to some pressure regulating means in order to establish and maintain the pressure inside the reaction compartment 12 in accordance with a preselected setpoint value. Typically, the pressure regulating means controllably throttles a valve through which the interior of the reaction compartment 12 communicates with a vacuum system. The setpoint is commonly chosen from a pressure range bounded by 25 mTorr and 3000 mTorr, although pressures from $10^{-5}$ Torr to 5 Torr and even outside this range may be preferred for some applications.

The temperature control system 26 may include several features that aid in temperature regulation of the compartment 12 and of the electrodes. For example, passageways, not shown, may allow the circulation of a heat transfer medium, such as water, within the upper electrode 14. Bores, not shown, may be provided through the compartment 12 to receive resistive heating elements. The lower electrode 16 may be apertured for the circulation thereinthrough of a heat transport medium, such as helium and/or water.

The present invention differs from the configuration described above primarily in the design and function of the temperature control system 26. The temperature control system of the invention is configured to maintain a process temperature at a constant steady-state value during treatment of the initial substrate(s) of a series by adjusting temperature-control parameters, for example fluid temperature or circulation rate, which affect the process temperature. As defined in this description, the temperature-control system includes elements involved in the exchange of heat with components in thermal contact with the substrate as well as those elements which actively adjust temperature-control parameters.

Figure 2:
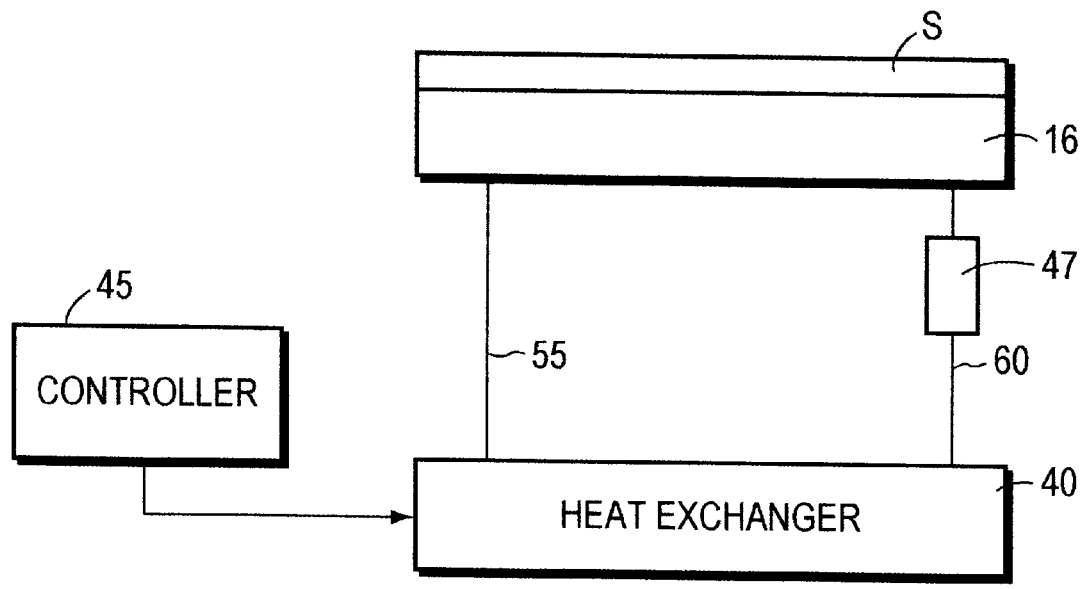
FIG. 2 schematically illustrates a temperature-control system of the invention.

One such temperature control system, shown in FIG. 2, features a heat exchanger 40 coupled to controller 45. A circulator 47 moves water through the system. Water leaves the heat exchanger 40 and is conveyed to the electrode through a first conduit 5. The water circulates through the electrode 16, which contains internal pathways configured to promote heat transfer between the electrode and the water, and returns to the heat exchanger through the second conduit 60. The controller 45 adjusts the operation of the heat exchanger 40 according to a preprogrammed schedule, consistent with the heat-generation rate of the direct-plasma process, that produces a substrate temperature having a substantially constant steady-state value of about 20° C. during processing of the transient substrate(s) of a series.

Figure 3:
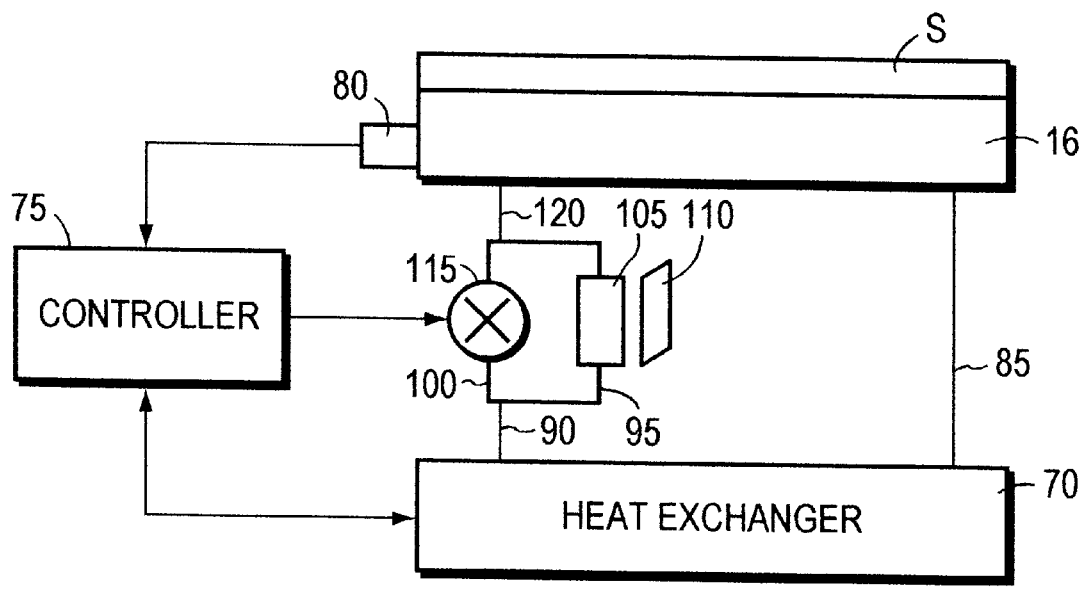
FIG. 3 schematically illustrates a temperature-control system of a preferred embodiment of the invention.

In a preferred embodiment of the temperature control system 26, shown in FIG. 3, a heat exchanger 70 is coupled to a controller 75 receiving temperature data from a thermocouple temperature sensor 80 in thermal contact with the lower electrode 16. Water leaving the electrode 16 passes through the conduit 85 and enters the heat exchanger 70, which adjusts the temperature of the water entering conduit 90 to a constant value. The conduit 90 divides into two branches 95 and 100. A flow restricter 105 limits fluid flow through the first branch 95, which is in thermal contact with a constant-wattage heater 110. A adjustable valve 115 controlling the fluid flow rate through the second branch 100 is coupled to the controller 75. In response to the data from the temperature sensor 80, the controller 75 adjusts the valve 115 so as to vary the proportion of water that has been heated to the total amount that enters the electrode 16 through a conduit 120, thereby providing a time-dependent heat sink to the electrode 16. Thus, the temperature control system compensates for the time-dependence of the electrode temperature due to the rf power supplied for plasma generation, thereby creating a steady-state thermal environment for the transient substrates.

It will therefore be seen that the foregoing represents a highly advantageous approach to direct-plasma processing of a series of substrates, especially for enhancing substrate-to-substrate uniformity in process outcome. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of consecutively treating a series of substrates with plasma by a uniform direct-plasma process, the series including at least one transient substrate and at least one subsequent substrate, the method comprising the steps of:
   a. providing power to an electrode to generate plasma;
   b. placing each substrate of the series in thermal contact with the electrode in succession, thereby treating the substrates of the series with plasma by the uniform direct-plasma process; and
   c. controlling a process temperature during treatment of the at least one transient substrate by providing supplemental heat so as to maintain the process temperature at a substantially constant steady-state value equal to a value taken on by the process temperature during treatment of the at least one subsequent substrate.

2. The method of claim 1 wherein the process temperature is controlled during treatment of the entire series of substrates so as to maintain the process temperature at the steady-state value.

3. The method of claim 1 wherein a substrate in treatment has a substrate temperature and the process temperature is the substrate temperature.

4. The method of claim 1 wherein the electrode has an electrode temperature and the process temperature is the electrode temperature.

5. The method of claim 1 wherein a circulating fluid having a fluid temperature circulates through the electrode at a circulation rate and the process temperature is the fluid temperature.

6. The method of claim 1 wherein a contact medium having a contact temperature enhances thermal contact between the substrate in treatment, and the electrode and the process temperature is the contact temperature.

7. The method of claim 1 wherein a circulating fluid having a fluid temperature circulates through the electrode at a circulation rate and wherein the step of controlling the process temperature comprises controlling the circulating fluid.

8. The method of claim 7 wherein controlling the circulating fluid comprises controlling the circulation rate.

9. The method of claim 7 wherein controlling the circulating fluid comprises controlling the fluid temperature.

10. The method of claim 1 wherein the steady-state value is determined from previous treatment of a group of substrates.

11. The method of claim 1 wherein the step of controlling the process temperature comprises the steps of:
   a. sensing a value of the process temperature; and
   b. adjusting temperature-control parameters based on the sensed value.

12. The method of claim 1 wherein the step of controlling the process temperature comprises adjusting temperature-control parameters according to a preprogrammed schedule.

13. The method of claim 1 wherein the at least one transient substrate is the first substrate of the series.

14. The method of claim 1 wherein the treatment etches the substrates.

15. The method of claim 1 wherein each of the series of substrates has a process characteristic, the method improving substrate-to-substrate similarity in the process characteristic.

16. The method of claim 15 wherein the process characteristic is processing time.

17. The method of claim 15 wherein the process characteristic is anisotropy.

18. The method of claim 1 wherein the step of controlling the process temperature occurs before the step of treating the at least one transient substrate.

19. A method of consecutively treating a series of substrates by a uniform direct-plasma etching process, the series including at least one transient substrate and at least one subsequent substrate, the method comprising the steps of:
   a. providing power to an electrode having an electrode temperature to generate plasma;
   b. placing each substrate of the series in thermal contact with the electrode in succession, thereby treating the substrates of the series with plasma by the uniform direct-plasma process; and
   c. controlling the electrode temperature during treatment of the at least one transient substrate by providing supplemental heat so as to maintain the electrode temperature at a substantially constant steady-state value equal to a value taken on by the electrode temperature during treatment of the at least one subsequent substrate.

20. The method of claim 19 wherein the electrode temperature is controlled during treatment of the entire series of substrates so as to maintain the electrode temperature at the steady-state value.

21. The method of claim 19 wherein a fluid having a fluid temperature circulates through the electrode at a circulation rate and wherein the step of controlling the electrode temperature comprises controlling the circulating fluid.

22. The method of claim 21 wherein the step of controlling the circulating fluid comprises controlling the circulation rate.

23. The method of claim 21 wherein the step of controlling the circulating fluid comprises controlling the fluid temperature.

24. The method of claim 19 wherein the steady-state value is determined from previous treatment of a group of substrates.

25. The method of claim 19 wherein the step of controlling the electrode temperature comprises the steps of:
   a. sensing a value of the electrode temperature; and
   b. adjusting temperature-control parameters based on the sensed value.

26. The method of claim 19 wherein the step of controlling the electrode temperature comprises adjusting temperature-control parameters according to a preprogrammed schedule.

27. The method of claim 19 wherein the electrode temperature is controlled before treatment of the transient substrate.

28. The method of claim 19 wherein each of the series of substrates has a process characteristic, the method improving substrate-to-substrate similarity in the process characteristic.

29. The method of claim 28 wherein the process characteristic is processing time.

30. The method of claim 28 wherein the process characteristic is anisotropy.

31. The method of claim 28 wherein the process characteristic is etch selectivity.

32. An apparatus for consecutively treating a series of substrates by a uniform direct-plasma process, the series including at least one transient substrate and at least one subsequent substrate, the apparatus comprising:
   a. an electrode;
   b. a source of electromagnetic excitation, coupled to the electrode so as to provide oscillating electromagnetic energy to the electrode, thereby generating plasma;
   c. a substrate-changing system configured to consecutively position substrates of the series to be treated by the uniform direct-plasma process on the electrode; and
   d. a temperature-control system configured to control a process temperature by providing supplemental heat during direct-plasma treatment of the at least one transient substrate in thermal contact with the electrode so as to maintain the process temperature at a substantially constant steady-state value equal to a value taken on by the process temperature during treatment of the at least one subsequent substrate.

33. The apparatus of claim 32 wherein the electrode has an electrode temperature and wherein the process temperature is the electrode temperature.

34. The apparatus of claim 32 wherein a substrate in treatment has a substrate temperature and the process temperature is the substrate temperature.

35. The apparatus of claim 32 wherein the temperature-control system comprises a mechanism for circulating a fluid having a fluid temperature through the electrode at a circulation rate.

36. The apparatus of claim 35 wherein the process temperature is the fluid temperature.

37. The apparatus of claim 32 wherein the temperature control system comprises a mechanism for supplying a contact medium for enhancing thermal contact between the substrate in treatment and the electrode.

38. The apparatus of claim 37 wherein the contact medium has a contact temperature and the process temperature is the contact temperature.

39. The apparatus of claim 35 wherein the temperature-control system comprises a mechanism for adjusting the circulation rate.

40. The apparatus of claim 34 wherein the temperature-control system comprises a mechanism for adjusting the fluid temperature.

41. The apparatus of claim 32 wherein the temperature-control system is configured to control the process temperature by adjusting temperature-control parameters according to a preprogrammed schedule.

42. The apparatus of claim 32 wherein the temperature-control system comprises a temperature sensor for sensing the process temperature.

43. The apparatus of claim 42 wherein the temperature-control system is configured to control the process temperature by adjusting temperature-control parameters based on the sensed process temperature.

44. The apparatus of claim 32 wherein the temperature-control system is configured to control the process temperature before treatment of the at least one transient substrate.

45. The apparatus of claim 32 wherein each of the series of substrates has a process characteristic, the apparatus improving substrate-to-substrate similarity in the process characteristic.

46. The apparatus of claim 45 wherein the process characteristic is processing time.

47. The apparatus of claim 45 wherein the process characteristic is anisotropy.

48. The apparatus of claim 45 wherein the process characteristic is etch selectivity.

49. An apparatus for consecutively treating a series of substrates by a uniform direct-plasma etching process, the series including at least one transient substrate and at least one subsequent substrate, the apparatus comprising:
   a. an electrode having an electrode temperature;
   b. a source of electromagnetic excitation, coupled to the electrode so as to provide oscillating electromagnetic energy to the electrode, thereby generating plasma;
   c. a substrate-changing system for consecutively positioning substrates of the series to be treated by the uniform direct-plasma process on the electrode; and
   d. a temperature-control system cooperating with the electrode for controlling the electrode temperature by providing supplemental heat during direct-plasma treatment of the at least one transient substrate in thermal contact with the electrode, so as to maintain the electrode temperature at a substantially constant steady-state value equal to a value taken on by the process temperature during treatment of the at least one subsequent substrate.

50. The apparatus of claim 49 wherein the temperature-control system comprises a mechanism for circulating a fluid having a fluid temperature through the electrode at a circulation rate.

51. The apparatus of claim 50 wherein the temperature-control system comprises a mechanism for adjusting the circulation rate.

52. The apparatus of claim 50 wherein the temperature-control system comprises a mechanism for adjusting the fluid temperature.

53. The apparatus of claim 49 further comprising a sensor, thermally coupled to the electrode, for sensing the electrode temperature.

54. The apparatus of claim 49 wherein the temperature-control system controls the electrode temperature by adjusting temperature-control parameters according to a preprogrammed schedule.

55. The apparatus of claim 53 wherein the temperature-control system controls the electrode temperature by adjusting temperature-control parameters based on the sensed electrode temperature.

56. The apparatus of claim 49 wherein the temperature-control system controls the electrode temperature before treatment of the at least one transient substrate.

57. The apparatus of claim 49 wherein each of the series of substrates has a process characteristic, the apparatus improving substrate-to-substrate similarity in the process characteristic.

58. The apparatus of claim 57 wherein the process characteristic is processing time.

59. The apparatus of claim 57 wherein the process characteristic is anisotropy.

60. The apparatus of claim 57 wherein the process characteristic is etch selectivity.

61. A method of consecutively treating a series of substrates with plasma by a uniform direct-plasma process, the series including at least one transient substrate and at least one subsequent substrate, the method comprising the steps of:
   a. providing power to an electrode to generate plasma;
   b. circulating fluid having a fluid temperature through the electrode at a circulation rate;
   c. placing each substrate of the series in thermal contact with the electrode in succession, thereby treating the substrates of the series with plasma by the uniform direct-plasma process; and
   d. controlling the fluid temperature during treatment of the at least one transient substrate to maintain the process temperature at a substantially constant steady-state value equal to a value taken on by the process temperature during treatment of the at least one subsequent substrate.

62. The method of claim 61 wherein the fluid temperature is the process temperature.

63. The method of claim 61 wherein the electrode has an electrode temperature, the electrode temperature being the process temperature.

64. A method of consecutively treating a series of substrates with plasma by a uniform direct-plasma process, the series including at least one transient substrate and at least one subsequent substrate, the method comprising the steps of:
   a. providing power to an electrode to generate plasma;
   b. placing each substrate of the series in thermal contact with the electrode in succession, thereby treating the substrates of the series with plasma by the uniform direct-plasma process;
   c. enhancing thermal contact between each substrate and the electrode by a contact medium having a contact temperature; and
   d. controlling the contact temperature during treatment of the at least one transient substrate to maintain the contact temperature at a substantially constant steady-state value equal to a value taken on by the contact temperature during treatment of the at least one subsequent substrate.

65. A method of consecutively treating a series of substrates with plasma by a uniform direct-plasma process, the series including at least one transient substrate and at least one subsequent substrate, the method comprising the steps of:

a. providing power to an electrode to generate plasma;
   b. placing each substrate of the series in thermal contact with the electrode in succession, thereby treating the substrates of the series with plasma by the uniform direct-plasma process; and
   c. controlling a process temperature during treatment of the at least one transient substrate, by adjusting temperature-control parameters according to a preprogrammed schedule, to maintain the process temperature at a substantially constant steady-state value equal to a value taken on by the process temperature during treatment of the at least one subsequent substrate.

66. The method of claim 65 wherein the electrode has an electrode temperature, the electrode temperature being the process temperature.

67. An apparatus for consecutively treating a series of substrates by a uniform direct-plasma process, the series including at least one transient substrate and at least one subsequent substrate, the apparatus comprising:

a. an electrode;
   b. a source of electromagnetic excitation, coupled to the electrode so as to provide oscillating electromagnetic energy to the electrode, thereby generating plasma;
   c. a substrate-changing system configured to consecutively position substrates of the series to be treated by the uniform direct-plasma process on the electrode;
   d. a mechanism for circulating a fluid having a fluid temperature through the electrode at a circulation rate; and
   e. a temperature-control system configured to control a process temperature during direct-plasma treatment of the at least one transient substrate in thermal contact with the electrode so as to maintain the process temperature at a substantially constant steady-state value equal to a value taken on by the process temperature during treatment of the at least one subsequent substrate, the temperature-control system comprising a mechanism for adjusting the fluid temperature.

68. The apparatus of claim 67 wherein the fluid temperature is the process temperature.

69. The apparatus of claim 67 wherein the electrode has an electrode temperature, the electrode temperature being the process temperature.

70. An apparatus for consecutively treating a series of substrates by a uniform direct-plasma process, the series including at least one transient substrate and at least one subsequent substrate, the apparatus comprising:

a. an electrode;
   b. a source of electromagnetic excitation, coupled to the electrode so as to provide oscillating electromagnetic energy to the electrode, thereby generating plasma;
   c. a substrate-changing system configured to consecutively position substrates of the series to be treated by the uniform direct-plasma process on the electrode;
   d. a mechanism for supplying a contact medium having a contact temperature for enhancing thermal contact between the substrate in treatment and the electrode; and
   d. a temperature-control system configured to control the contact temperature during direct-plasma treatment of the at least one transient substrate in thermal contact with the electrode so as to maintain the contact temperature at a substantially constant steady-state value equal to a value taken on by the contact temperature during treatment of the at least one subsequent substrate.

71. An apparatus for consecutively treating a series of substrates by a uniform direct-plasma process, the series including at least one transient substrate and at least one subsequent substrate, the apparatus comprising:

a. an electrode;
   b. a source of electromagnetic excitation, coupled to the electrode so as to provide oscillating electromagnetic energy to the electrode, thereby generating plasma;
   c. a substrate-changing system configured to consecutively position substrates of the series to be treated by the uniform direct-plasma process on the electrode; and
   d. a temperature-control system configured to control a process temperature during direct-plasma treatment of the at least one transient substrate in thermal contact with the electrode, by adjusting temperature-control parameters according to a preprogrammed schedule, so as to maintain the process temperature at a substantially constant steady-state value equal to a value taken on by the process temperature during treatment of the at least one subsequent substrate.

72. The apparatus of claim 71 wherein the electrode has an electrode temperature, the electrode temperature being the process temperature.

* * * * *